United States Patent [19]

Willis

[11] Patent Number: 4,636,732
[45] Date of Patent: Jan. 13, 1987

[54] APPARATUS FOR MEASURING ELECTRICAL POTENTIAL IN A CELL

[75] Inventor: Peter M. Willis, Oxfordshire, Great Britain

[73] Assignee: Johnson Matthey Public Limited Company, London, England

[21] Appl. No.: 512,993

[22] Filed: Jul. 12, 1983

[30] Foreign Application Priority Data

Jul. 28, 1982 [GB] United Kingdom ............... 8221814

[51] Int. Cl.[4] ........................................... G01N 27/42
[52] U.S. Cl. .................................. 324/425; 324/72.5; 324/450; 204/400
[58] Field of Search .......... 324/94, 425, 439, 444-449, 324/437, 72.5, 158 P, 71.2, 450; 204/400, 242, 244, 280, 435, 292, 293, 73 R, 411, 412; 339/22 R; 174/10, 19, 24, 65 R, 68 L

[56] References Cited

U.S. PATENT DOCUMENTS

| | | | |
|---|---|---|---|
| 2,376,694 | 5/1945 | Hewlett | 137/115 |
| 2,584,816 | 2/1952 | Sands | 204/412 |
| 2,842,736 | 7/1958 | Heyd et al. | 204/412 |
| 3,208,919 | 9/1965 | Sennett | 204/1 T |
| 4,013,522 | 3/1977 | Nischik et al. | 204/411 |
| 4,031,291 | 6/1977 | Fullenwider | 429/40 |
| 4,152,489 | 5/1979 | Chottiner | 429/27 |
| 4,414,071 | 11/1983 | Cameron | 204/242 |

*Primary Examiner*—Stewart J. Levy
*Assistant Examiner*—Kevin D. O'Shea
*Attorney, Agent, or Firm*—Cushman, Darby & Cushman

[57] ABSTRACT

Apparatus for measuring electrical potential in a cell, especially at a point close to a sample electrode, comprises an accommodation for a reference electrode, a modified luggin tube, elements for locating the sample electrode, and supports for both the luggin tube and the locating elements, respectively, the supports being fixed relative to each other. The apparatus requires less skill in the positioning of the sample electrode close to the point at which electrical potential is measured and is less vulnerable to inadvertent disturbance.

8 Claims, 5 Drawing Figures

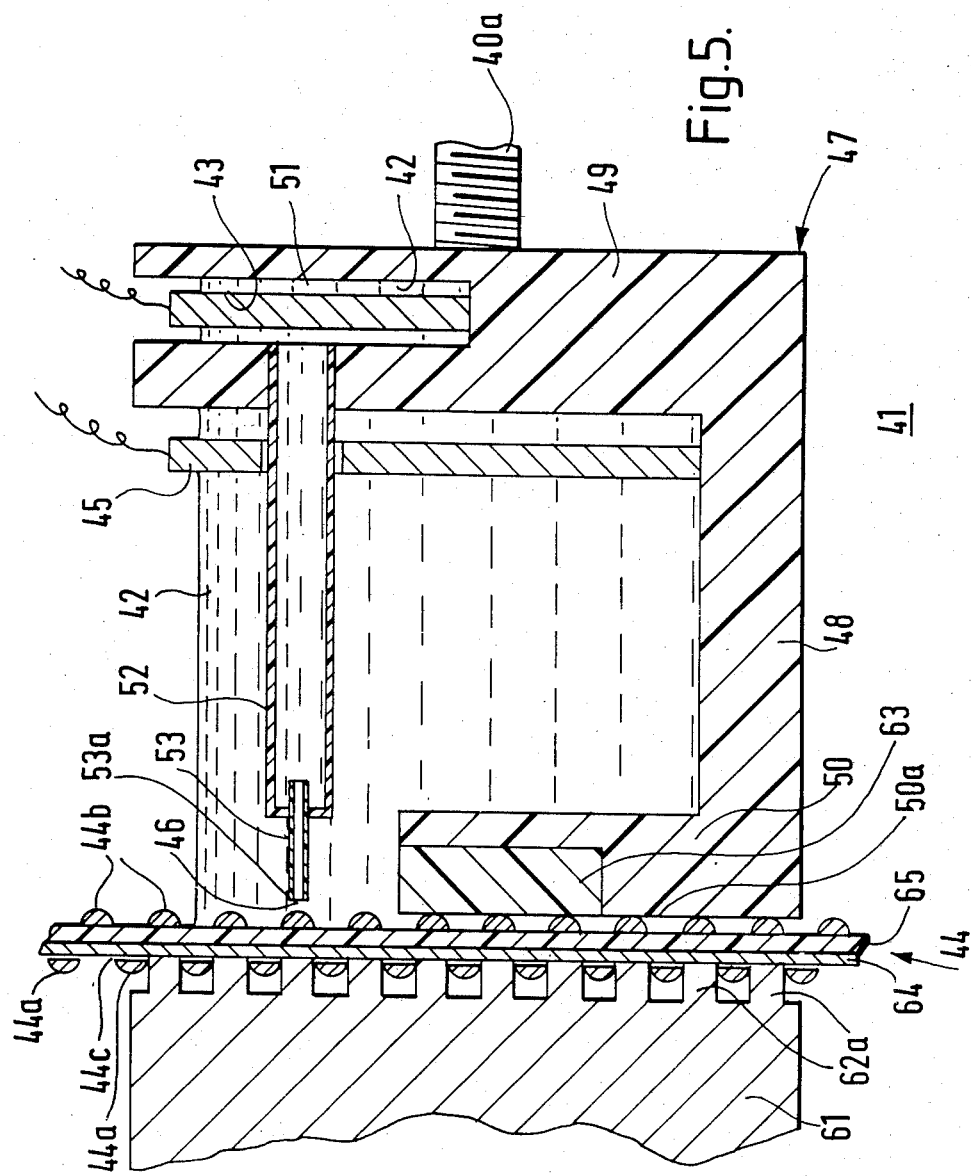

APPARATUS FOR MEASURING ELECTRICAL POTENTIAL IN A CELL

BACKGROUND OF THE INVENTION

1. Field of the Invention

This invention relates to an apparatus suitable for use in measuring electrical potential in a cell, especially potential close to an electrode at which a gas is evolved. Measurement of potential at a point close to such an electrode can give a value for the overpotential of the electrode. The overpotential in turn gives an indication of the usefulness of the electrode in electrolytic processes which evolve gas, for example the chloralkali process.

2. Description of the Prior Art

Potential close to an electrode has hitherto been measured using a reference electrode and a so-called "luggin tube" assembly. In a conventional luggin tube assembly, the reference electrode is accommodated in a vertical glass sleeve open at the top but closed at the base except for a communication with one end of a thin horizontal glass tube known as a luggin tube. The communicating end of the luggin tube is sealed into the sleeve to prevent entry of electrolyte from outside the assembly whereas the other end of the luggin tube is open to entry by electrolyte. To measure the potential in a cell at a point which is at a pre-selected distance from a sample electrode, the luggin tube assembly is lowered base first into the electrolyte of the cell and its vertical sleeve is clamped in a position such that the open end of the luggin tube is located at the pre-selected distance from the sample electrode. On immersion, electrolyte enters the open end of the luggin tube and then partially fills the vertical sleeve. The glass walls of the tube and sleeve (being electrically non-conductive) shield the electrolyte within the luggin tube assembly from variations in potential elsewhere in the cell with the result that the potential within the assembly is constant and in particular the potential at the reference electrode is equal to that at the open end of the luggin tube. Clearly therefore a luggin tube assembly provides means for communicating the potential at a pre-selected point in a cell to a reference electrode.

Conventional luggin tube assemblies require considerable dexterity in order to be able to locate the open end of the luggin tube accurately at the pre-selected distance from the sample electrode. Consequently accurate comparative measurements have been difficult to achieve, especially when more than one operator is involved. The difficulty is aggravated by the sensitivity of the assembly to inadvertent knocks or vibrations especially when these impart disturbing forces which are transverse to the luggin tube. An object of this invention is to provide an apparatus for measuring electrical potential in a cell which apparatus requires less skill to operate and is less sensitive to inadvertent disturbance.

SUMMARY OF THE INVENTION

Accordingly this invention provides an apparatus suitable for use in measuring electrical potential in a cell containing electrolyte and a sample electrode, wherein the apparatus comprises:

(a) accommodation means for a reference electrode, (b) a conduit enclosed by electrically non-conductive material (preferably a narrow tube defined by for example glass, polyolefin or polytetrafluoroethylene i.e. PTFE, walls), the conduit having a first end which is open to entry by electrolyte contained in the cell and a second end which is in communication with the accommodation means for the reference electrode, (c) location means for the sample electrode, and (d) a support for the conduit and a support for the location means wherein the support for the conduit includes means fixed relative to the support for the location means.

The use of such support means which are fixed relative to each other facilitates accurate positioning of the open end of the conduit relative to the sample electrode and also minimises errors caused by inadvertent disturbance of the apparatus.

Preferably the sample electrode should have a flat surface which has an area at least three times greater than the cross-sectional area of the open end of the conduit and the location means should position the sample electrode so that the flat surface extends transversely of the axis of the conduit. Because the supports for the conduit and sample electrode are fixed relative to each other, the most serious inadvertent disturbances are likely to be those which cause transverse vibration of the conduit but, if the sample electrode has a flat surface which is transverse of the conduit, the transverse vibration of a long conduit will cause its open end to move in an arc which is almost parallel to the flat surface with the result that the open end will move approximately in a plane of constant potential. This further minimises errors caused by disturbances. Clearly the arc of movement of the open end will better approximate to a straight line as the length of the conduit is increased. However the preferred conduits are narrow tubes which are therefore liable to be flexible in long lengths. Accordingly it is preferred to avoid the need to use an unduly flexible conduit and yet still retain a large radius of curvature for the arc of movement of its open end. This can be done by mounting a short length of conduit in an intermediate support comprising a (usually longer) length of a broader and hence more rigid conduit also enclosed by electrically non-conducting material.

Preferably the support for the location means and at least a non-intermediate part of the support for the conduit should form a unitary (preferably integral) structure in order to provide an especially sturdy apparatus. Conveniently the unitary structure may also define a container for the electrolyte. The accommodation means for the reference electrode may comprise a chamber formed in the container for the electrolyte in which case the apparatus is compact and easily portable.

The location means may position the sample electrode at a fixed pre-selected distance from the end of the conduit, the pre-selected distance being determined by the choice of the dimensions of the conduit, its support and the support for the location means. Such location means are simple to operate and therefore are particularly suited to measuring the overpotential of industrial electrodes while the electrodes are in use in a commercial process. Alternatively the location means and/or the support for the conduit may be provided with adjustment means which allow an accurately controllable relative movement of the sample electrode and the open end of the conduit towards or away from each other such that potential can be measured at a variety of alternative pre-selected distances from the sample electrode.

The ability to vary the pre-selected distances is of value in laboratory work.

The open end of the conduit should be narrow, preferably having a maximum transverse internal dimension of from 0.2 to 0.8 mm so that it is exposed to only a small area of electrolyte which can be safely approximated to a point.

A preferred reference electrode for use with the apparatus of this invention is broadly described in British patent specification No. 2,074,190 A or in the specification filed with U.S. patent application Ser. No. 254,494 the contents of both of which are herein incorporated by reference. For example these patent specifications describe an electrode comprising an electrically conductive (usually base metal, preferably nickel) substrate carrying a surface layer comprising platinum or a mixture of platinum and ruthenium. The surface layer is preferably deposited by an exchange reaction brought about by immersing the substrate in a (preferably aqueous) solution of a platinum compound or a mixture of platinum and ruthenium compounds whereupon spontaneous exchange of metal from the substrate with platinum or platinum and ruthenium moieties in solution occurs causing deposition of platinum or a mixture of platinum and ruthenium.

This invention also provides a cell suitable for measuring electrical potential close to a sample electrode wherein the cell comprises an apparatus according to this invention provided with a reference electrode, a sample electrode, a counter electrode and a quantity of electrolyte.

BRIEF DESCRIPTION OF THE DRAWINGS

The invention is further illustrated by the following preferred embodiments which are described with reference to the drawings of which:

FIG. 5 is a vertical section on a larger scale taken on the line A—A through part of the apparatus shown in FIG. 4.

DETAILED DESCRIPTION OF THE PREFERRED EMBODIMENTS

Figure 1:
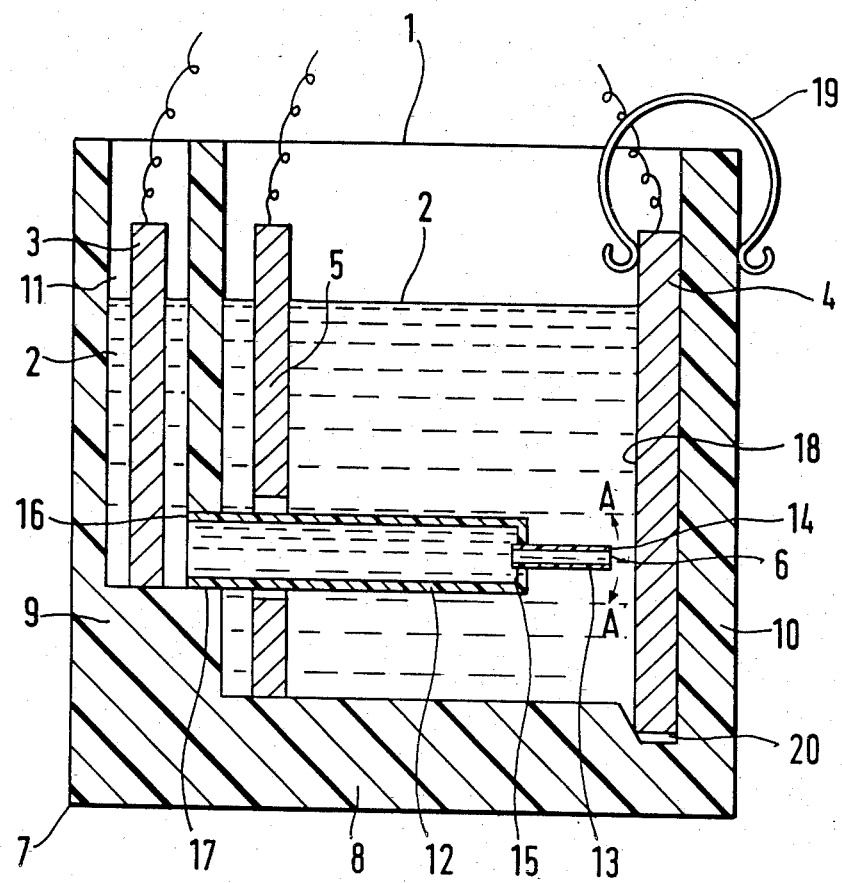
FIG. 1 is a section through a cell comprising an apparatus according to this invention.

FIG. 1 shows a cell 1 comprising a quantity of electrolyte 2, reference electrode 3, a sample electrode 4, a counter electrode 5 and an apparatus for measuring electrical potential at a point 6 close to sample electrode 4. The apparatus comprises a unitary structure 7 made from crystalline polypropylene and having a base 8 and side walls 9 and 10 which define a container for electrolyte 2. Accommodation means for reference electrode 3 is provided by a vertical blind bore 11 formed in side wall 9. Communication of the potential at point 6 to reference electrode 3 is achieved using the luggin tube principle via conduits enclosed and defined by a combination of an intermediate rigid horizontal broad crystalline polypropylene tube 12 and horizontal open-ended narrow PTFE tube 13 that has an end 14 which encompasses point 6 and is open to entry by electrolyte 2 contained in cell 1. Narrow tube 13 makes a fixed liquid-tight fit in a closed end 15 of broad tube 12 which in turn has an open 16 that makes a fixed liquid-tight fit in a hole 17 in side wall 9.

Location of a flat surface 18 of sample electrode 4 at a pre-selected distance from point 6 and perpendicularly to the axis of the narrow tube 13 is achieved by the co-operation of a resilient clip 19 and a bevelled rebate 20 in base 8 with side wall 10 so as to position sample electrode 4 firmly against side wall 10. It will be appreciated that for clip 19, the surfaces defining rebate 20 and side wall 10 are supported by base 8. Base 8 is fixed relative to side wall 9 which provides the support for tubes 12 and 13. This arrangement means that location of the sample electrode 4 at a fixed pre-selected distance from end 14 of narrow tube 13 is a simple operation requiring no special skill or care.

The use of broad tube 12 enables the length of narrow tube 13 to be quite short which minimises errors caused by inadvertent transverse vibrations because broad tube 12 (being rigid) is more resistant to such vibration. Even if broad tube 12 should vibrate transversely, the arc (shown by arrows A in FIG. 1) along which open end 14 would move is so very nearly parallel to transverse surface 18 of sample electrode 4 that open end 14 would virtually move in a plane of constant potential in which case errors would be minimal.

Figure 2:
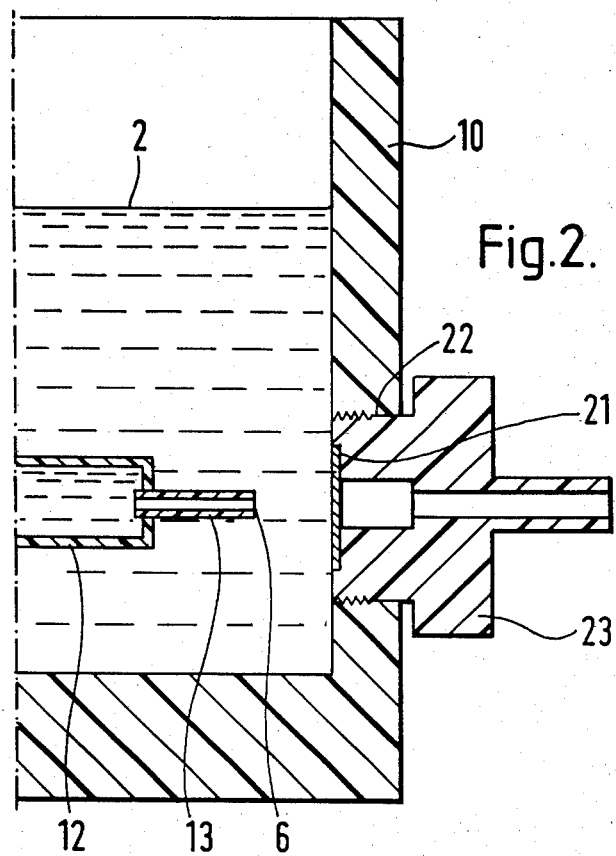
FIG. 2 is a section through part of a cell comprising a modification of the cell apparatus shown in FIG. 1 which permits adjustable location of a sample electrode.

FIG. 2 shows a modification of cell 1 and apparatus shown in FIG. 1 in which sample electrode 4 is replaced by a smaller disc-shaped sample electrode 21 and side wall 10 contains an aperture 22 which receives a plug 23 which serves as a location means for sample electrode 21.

Figure 3:
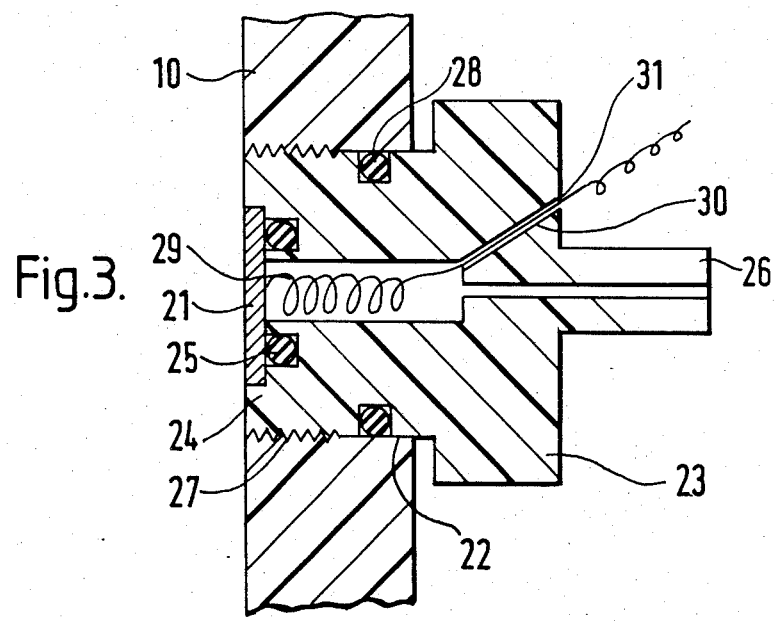
FIG. 3 is a section through the plug and aperture shown in FIG. 2 but drawn to a larger scale and showing additional detail.

FIG. 3 shows that sample electrode 21 seats in a close-fitting recess 24 formed in plug 23 in side wall 10 and sample electrode 21 is held against an 'O' ring seal 25 by a pressure differential generated by connecting hollow stem 26 to a vacuum pump (not shown).

Aperture 22 and plug 23 have a co-operating screw thread system 27 which permits accurately controllable movement of plug 23 along the line of the axis of narrow tube 13 so permitting selectable variations in the distance of sample electrode 21 from point 6.

Plug 23 also contains 'O' ring seal 28 and sprung electrical contact wire 29 which makes a gas-tight fit in bore 30 by means of a cement seal 31.

Figure 4:
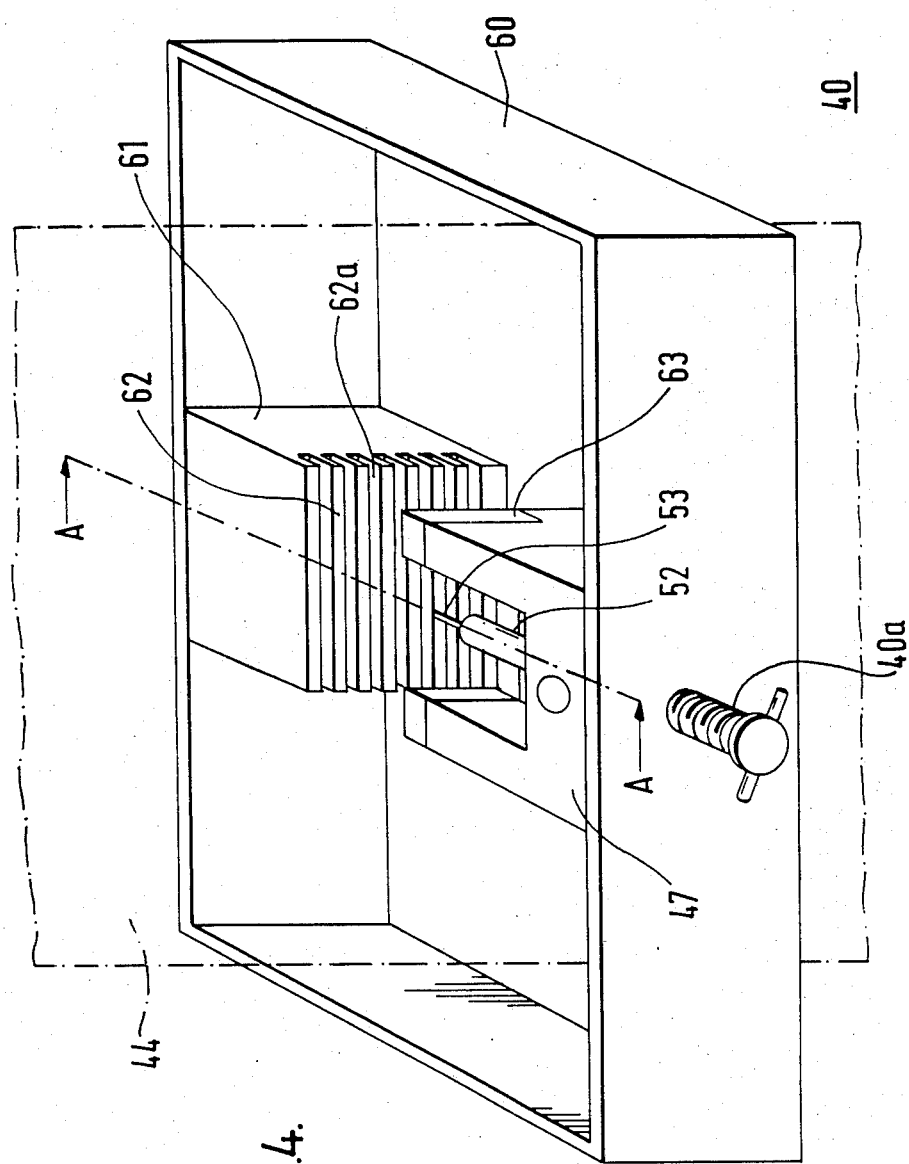
FIG. 4 is a perspective view of an alternative apparatus which is suitable for making measurements on a corrugated electrode of a type found in industrial use.

FIG. 4 shows an alternative apparatus 40 suitable for measuring electrical potential close to a sample electrode which is a well know type of commercial corrugated electrode 44 indicated by ghost lines) without the need to interrupt the industrial use of electrode 44. A difficulty in making such measurements arises because electrode 44 comprises oppositely facing pairs of adjacent corrugations 44a and 44b (as shown in FIG. 5) which are severed from each other except at their ends 44c. The presence of oppositely facing severed corrugations 44a and 44b creates difficulties in sealing electrode 44 within a cell suitable for measuring overpotential. The purpose of apparatus 40 in FIG. 4 is to overcome these difficulties.

Apparatus 40 comprises a bottomless frame 60 which supports block 61 and screw 40a which in turn carries unitary clamping strucuture 47. Clamping structure 47 block 61 are positioned on sides of frame 60 such that they face each other. Clamping structure 47 can be advanced and retracted to and from block 61 by screw 40a. Frame 60 is made from a rigid material, e.g. stainless steel. Unitary clamping structure 47 is made from crystalline polypropylene and is shown in further detail in FIG. 5. However, still referring to FIG. 4, the support block 61 has a front face 62 which has a plurality of parallel protrusions 62a. Block 61 serves to locate corrugated electrode 44 by receiving corrugations 44a between protrusions 62a. Electrode 44 is then held in position by advancing unitary structure 47 to the position as shown in FIG. 5.

FIG. 5 shows a cell 41 located within frame 60 (not shown in FIG. 5) and comprising a quantity of electrolyte 42, a reference electrode 43, sample corrugated electrode 44 held in block 61 by unitary clamping structure 47, a counter electrode 45, and a luggin-tube assembly for measuring electrical potential at a point 46 close to sample electrode 44. Unitary clamping structure 47 includes a base 48 and side walls 49 and 50 which define part of a container for electrolyte 42. Side wall 50 has a section of lower elevation to enable luggin tube 53 to be positioned near to electrode 44. In side 50a of wall 50, there is an inset 63 of caustic resistant rubber, (for example ethylene-propylene rubber).

Accommodation means for reference electrode 43 is provided by a vertical blind bore 51 formed in side wall 49. Communication of the potential at point 46 to reference electrode 43 is achieved using the luggin tube principle via the luggin-tube assembly which consists of conduits enclosed and defined by a horizontal open-ended narrow PTFE luggin tube 53, supported in cell 41 via screw 40a and clamping structure 47, and by an intermediate rigid horizontal broad crystalline polypropylene tube 52. Luggin tube 53 has an end 53a which encompasses point 46 and is open to entry by electrolyte 42 contained in cell 41.

In operation, the bottomless frame 60 of FIG. 4 is placed below corrugated electrode 44 and then raised so that electrode 44 passes between support block 61 and clamping structure 47. Corrugations 44a shown in FIG. 5 are located between pairs of protrusions 62a. Then a gasket 65 backed by plate 64 is inserted between corrugations 44a and 44b to make a liquid-tight seal. Clamping structure 47 is then advanced by screw 40a into abutment against corrugations 44b so as to clamp electrode 44 and also to make a liquid-tight seal with corrugations 44b. Once the liquid-tight seals have been established, cell 41 becomes an isolated system suitable for measuring potential close to corrugated electrode 44. Moreover, the isolated system can be established with minimum disturbance to operation of an industrial cell 41.

I claim:

1. A cell containing electrolyte, wherein the cell comprises:

a sample electrode;
   a reference electrode spaced from the sample electrode;
   a counter electrode, arranged intermediate the sample electrode and the reference electrode, said reference electrode measuring electrical potential a predetermined distance from the sample electrode;
   accommodation means for the reference electrode;
   a first narrow conduit enclosed by electrically non-conductive material, said first conduit having a first end which is open to entry by electrolyte and a second end which is in communication with the accommodation means for the reference electrode;
   a second conduit defined by electrically non-conducting material as an intermediate support means for mounting the first conduit near the second end thereof with an external fluid-tight fit, said second conduit being broader than the first conduit;
   location means for the sample electrode;
   a support for the location means, wherein there are means fixed relative to the support for the location means, so that the sample electrode is disposed a predetermined distance from the first end of the first conduit.

2. The cell according to claim 1 wherein the location means is disposed relative to the first conduit such that the sample electrode extends transversely of the axis of the first conduit.

3. The cell according to claim 1 wherein the support for the location means forms a part of a unitary structure which defines a container for the electrolyte.

4. The cell according to claim 3 wherein the accommodation means for the reference electrode comprises a chamber formed in the container for the electrolyte.

5. The cell according to claim 1 wherein the location means is provided with adjustment means which allow controllable relative movement of the sample electrode and the open first end of the first conduit towards or away from each other.

6. The cell according to claim 1 adapted to accommodate a corrugated sample electrode wherein the location means for the corrugated sample electrode comprises a plurality of parallel protrusions defining recesses therebetween whereby a recess can accommodate a corrugation of the sample electrode enabling the corrugated sample electrode to fit within the location means.

7. The cell according to claim 1 wherein the reference electrode includes an electrically conductive substrate carrying a surface layer of platinum.

8. Apparatus according to claim 7 wherein the surface layer comprises a mixture of platinum and ruthenium.

* * * * *